United States Patent [19]

Nishikawa et al.

[11] Patent Number: 5,032,811
[45] Date of Patent: Jul. 16, 1991

[54] MAGNETOSTATIC WAVE FILTER

[75] Inventors: Toshio Nishikawa; Hiroaki Tanaka; Satoru Shinmura, all of Nagaokakyo, Japan

[73] Assignee: Murata Manufacturing Co., Ltd., Kyoto, Japan

[21] Appl. No.: 459,028

[22] Filed: Dec. 29, 1989

[30] Foreign Application Priority Data

Jan. 13, 1989 [JP] Japan ...................... 1-6404

[51] Int. Cl.⁵ .................. H01P 1/215; H01P 1/207
[52] U.S. Cl. ................................. 333/208; 333/202; 333/219.2
[58] Field of Search ............... 333/201, 202, 208–212, 333/219.2, 230, 227

[56] References Cited

U.S. PATENT DOCUMENTS

| 2,948,868 | 8/1960 | Reeves | 333/209 X |
| 3,001,154 | 9/1961 | Reggia | 333/209 |
| 3,202,945 | 8/1965 | Tachizawa et al. | 333/230 |
| 3,889,213 | 6/1975 | Vittoria et al. | 333/209 |
| 3,919,673 | 11/1975 | Kostelnick | 333/211 X |
| 4,291,287 | 9/1981 | Young et al. | 333/209 X |

FOREIGN PATENT DOCUMENTS

| 2521786 | 8/1983 | France | 333/202 |
| 0277201 | 12/1986 | Japan | 333/208 |
| 1190430 | 11/1985 | U.S.S.R. | 333/208 |
| 1385164 | 3/1988 | U.S.S.R. | 333/202 |

Primary Examiner—Eugene R. Laroche
Assistant Examiner—Seung Ham
Attorney, Agent, or Firm—Jordan and Hamburg

[57] ABSTRACT

A magnetostatic wave filter comprises a waveguide having a cut-off frequency region. In this waveguide, a YIG thin film is installed as a ferrimagnetic base material. Also, the cut-off frequency region of this waveguide comprises an attenuation band of the magnetostatic wave filter. Electromagnetic wave in the attenuation band of the magnetostatic wave filter is attenuated by this waveguide.

8 Claims, 5 Drawing Sheets

F I G. 1A
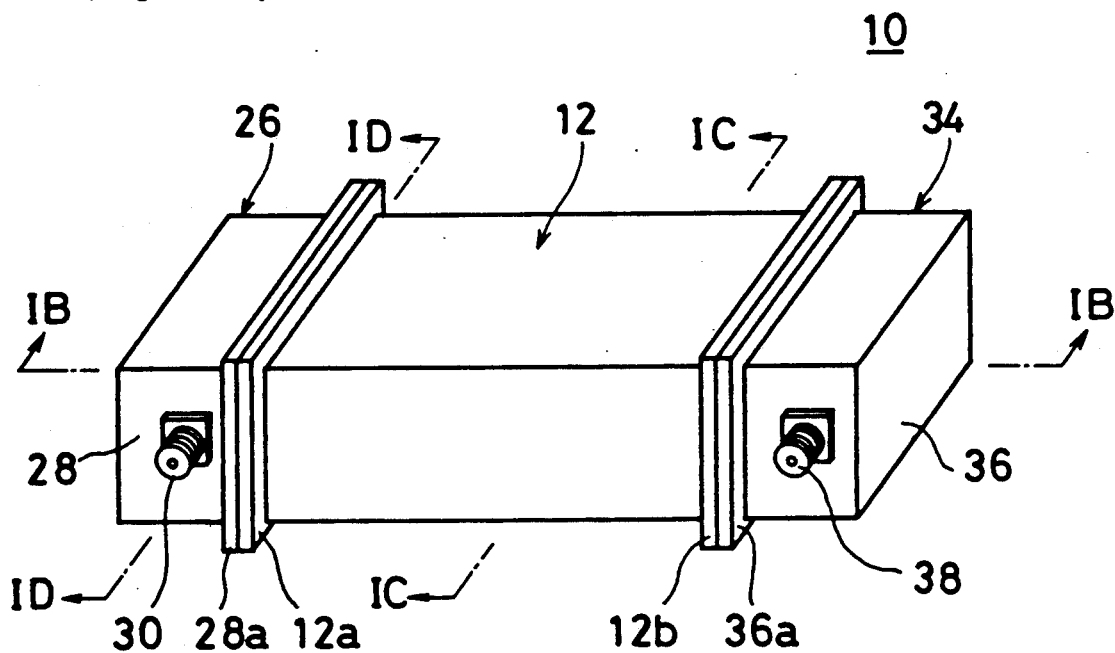
F I G. 1B
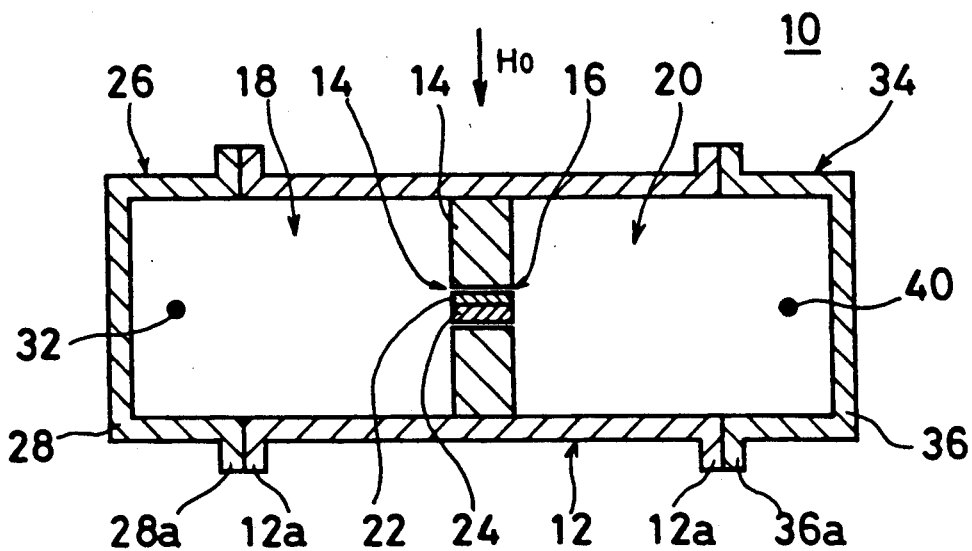

MAGNETOSTATIC WAVE FILTER

BACKGROUND OF THE INVENTION

1. Field of the Invention

The present invention relates to a magnetostatic wave filter, and specifically relates to a magnetostatic wave filter using ferrimagnetic base material, for example, a YIG (Yttrium, Iron, Garnet) thin film.

2. Description of the Prior Arts

FIG. 3 is an illustrative view showing an example of the conventional magnetostatic wave filter. In this magnetostatic wave filter 1, a GGG (Gadolinium, Gallium, Garnet) substrate 3 is installed on a grounded conductor 2, and a YIG thin film 4 is formed on this GGG substrate 3. Furthermore, on the YIG thin film 4, an input antenna 5a and an output antenna 5b each consisting of a wire are formed in parallel with a space therebetween.

FIG. 4 is an illustrative view showing another example of the conventional magnetostatic wave filter. In this magnetostatic wave filter 1, in comparison with the conventional example as shown in FIG. 3, particularly, another YIG thin film 6 is formed on the YIG thin film 4 so as to cover the input antenna 5a and the output antenna 5b. Furthermore, a separate GGG substrate 7 is formed on this YIG thin film 6.

FIG. 5 is an illustrative view showing still another example of the conventional magnetostatic wave filter. In this magnetostatic wave filter 1, in comparison with the conventional example as shown in FIG. 3, particularly, the GGG substrate 3 is mounted on the inner bottom of a hollow cylindrical cavity 8 consisting of metal. Then, two coaxial connectors 9a and 9b are installed on the side surface of this cavity 8, and the input antenna 5a and the output antenna 5b are connected to the core conductors of these coaxial connectors 9a and 9b, respectively.

In this magnetostatic wave filter as shown in FIG. 3 and the magnetostatic wave filter as shown in FIG. 4, the amount of attenuation of the attenuation band thereof is not so large due to electromagnetic wave transmitted from the input antenna directly to the output antenna.

On the other hand, in the magnetostatic wave filter as shown in FIG. 5, as the frequency characteristic thereof is shown in FIG. 6, spurious radiation is generated by a resonance mode of the cavity.

SUMMARY OF THE INVENTION

Therefore, a principal object of the present invention is to provide a magnetostatic wave filter, wherein the amount of attenuation in an attenuation band is large and spurious radiation is scarcely generated.

The present invention is of a magnetostatic wave filter comprising a waveguide having a cut-off frequency region and a ferrimagnetic base material installed in the waveguide, wherein the cut-off frequency region of the waveguide comprises an attenuation band.

Unnecessary electromagnetic waves in the attenuation band are attenuated by the waveguide.

In accordance with the present invention, unnecessary electromagnetic waves in the attenuation band are attenuated, and therefore the amount of attenuation in the attenuation band becomes large. Furthermore, in accordance with the present invention, no cavity is used, and therefore a generation of spurious radiation caused by the resonance mode of the cavity is prevented. For this reason, spurious radiation is scarcely generated.

Also, by forming the waveguide smaller than the cavity, the whole size can be made smaller in comparison with the magnetostatic wave filter using the cavity.

These objects and other objects, features, aspects and advantages of the present invention will become more apparent from the following detailed description of the embodiments of the present invention when taken in conjunction with accompanying drawings.

BRIEF DESCRIPTION OF THE DRAWINGS

FIG. 1A through FIG. 1D show an embodiment of the present invention respectively, FIG. 1A is a perspective view thereof, FIG. 1B is a cross-sectional view taken along line IB—IB in FIG. 1A, FIG. 1C is a cross-sectional view taken along line IC—IC in FIG. 1A, and FIG. 1D is a cross-sectional view taken along line ID–ID in FIG. 1A.

FIG. 2A is a perspective view thereof, FIG. 2B is a cross-sectional illustrative view taken along line IIB—IIB in FIG. 2A, and FIG. 2C is a cross-sectional view taken along line IIC—IIC in FIG. 2A.

DESCRIPTION OF THE PREFERRED EMBODIMENTS

Figure 1C:
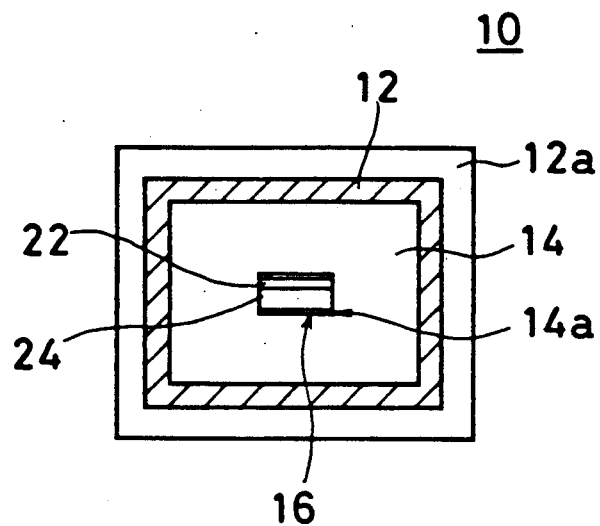
Figure 1D:
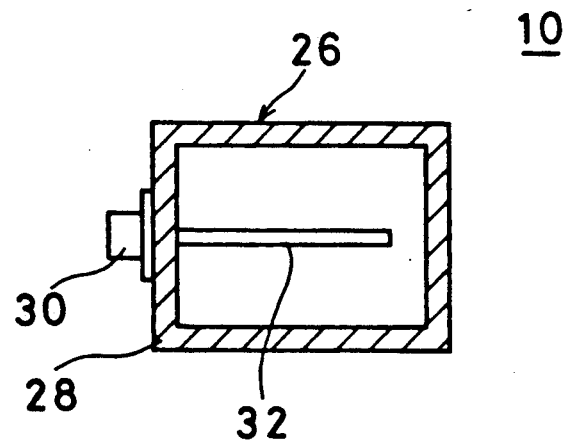

FIG. 1A through FIG. 1D show an embodiment of the present invention respectively, FIG. 1A is a perspective view thereof, FIG. 1B is a cross-sectional view taken along line IB—IB in FIG. 1A, FIG. 1C is a cross-sectional view taken along line IC—IC in FIG. 1A, and FIG. 1D is a cross-sectional view taken along line ID—ID in FIG. 1A.

DETAILED DISCLOSURE OF THE INVENTION

This magnetostatic wave filter 10 comprises a rectangular-prism-shaped housing 12 consisting, for example, of metal having flange parts 12a and 12b at the both ends thereof. In this housing 12, as shown particularly in FIG. 1B, a partition plate 14 consisting, for example, of metal is installed at the center in the lengthwise direction thereof. A long rectangular-shaped hole 14a is formed at the center of this partition plate 14. Then, a waveguide 16 is constituted in the portion defining the hole 14a of the partition plate 14. In this case, the waveguide 16 is formed in a size having a cut-off frequency region in the band comprising an attenuation band of this magnetostatic wave filter 10.

Also, another waveguide 18 is constituted in the portion from one end in the lengthwise direction to the center of the housing 12, and still another waveguide 20 is constituted in the portion from the other end to the center of the housing 12. Accordingly, the waveguides 18 and 20 are connected respectively to the both ends of the central waveguide 16.

In the central waveguide 16, that is, in the hole 14a of the partition plate 14, as shown particularly in FIG. 1B and FIG. 1C, a YIG thin film 22 is installed as a ferrimagnetic base material. In addition, this YIG thin film 22 is formed on one of the main surfaces of a GGG substrate 24 as a bed.

On the other hand, as shown in FIG. 1A and FIG. 1B, an input-side transducer 26 is attached to one end of the waveguide 18, that is, the flange part 12a of the housing 12. This transducer 26 comprises a box-shaped cover 28 having a flange part 28a at the open end. This cover 28 is attached to one end of the housing 12 by sticking the flange part 28a to the flange part 12a of the housing 12. A coaxial connector 30 is installed in this cover 28 in a manner penetrating it. Furthermore, as shown particularly in FIG. 1D, a rod antenna 32 is connected to the core conductor of the coaxial connector 30, and this rod antenna 32 is disposed in the cover 28. Accordingly, when a signal is inputted to the coaxial connector 30, it can be propagated from the rod antenna 32 to the waveguide 18 side as electromagnetic wave.

At the same time, an output-side transducer 34 is attached to one end of the waveguide 20, that is, the flange part 12b of the housing 12. Like the input-side transducer 26, this output-side transducer 34 also comprises a cover 36 having a flange part 36a at the open end, and this flange part 36a is stuck to the flange part 12b of the housing 12. Then, a coaxial connector 38 is installed in a penetrating fashion also in this cover 36. Furthermore, a rod antenna 40 is connected also to the core conductor of this coaxial connector 38, and this rod antenna 40 is disposed in the cover 36. Accordingly, the electromagnetic wave propagating through the waveguide 20 can be received by this rod antenna 40.

Also, as shown by an arrow $H_0$ in FIG. 1B, a dc magnetic field is applied to this magnetostatic wave filter 10 in the direction orthogonal to the main surface of the YIG thin film 22.

In this magnetostatic wave filter 10, a signal of TEM mode is inputted to the coaxial connector 30 of the input-side transducer 26, for example, by a coaxial cable. Then, this signal is propagated as electromagnetic wave of $TE_{10}$ mode from the rod antenna 32 of the transducer 26 to the central waveguide 16 side through the waveguide 18.

Then, the electrostatic wave of $TE_{10}$ mode is propagated as magnetostatic forward volume wave (MSFVW) to the waveguide 20 side on the YIG thin film 22 in the waveguide 16.

Then, the magnetostatic forward volume wave is propagated as electromagnetic wave of $TE_{10}$ mode to the output-side transducer 34 side through the waveguide 20. Then, this electromagnetic wave of $TE_{10}$ mode is received by the rod antenna 40 of the transducer 34, being outputted as a signal of TEM mode from the coaxial connector 38.

In this magnetostatic wave filter 10, the YIG thin film 22 is installed in the waveguide 16 having the cut-off frequency region in the band comprising the attenuation band thereof, and therefore unnecessary electromagnetic waves are removed in comparison with the conventional example. For this reason, the amount of attenuation in the attenuation band becomes large.

Figure 3:
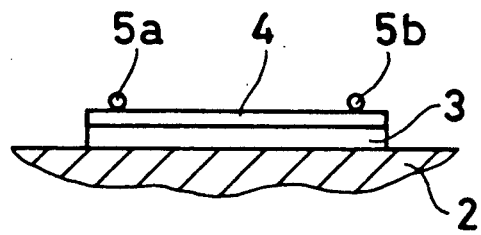
FIG. 3 is an illustrative view showing an example of the conventional magnetostatic wave filter.
Figure 4:
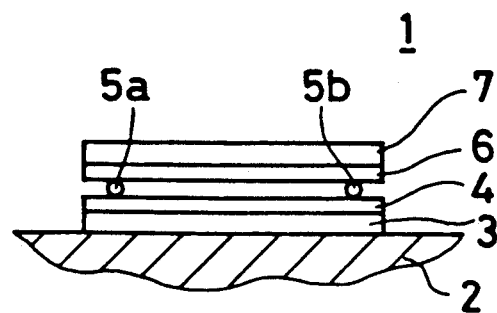
FIG. 4 is an illustrative view showing another example of the conventional magnetostatic wave filter.
Figure 5:
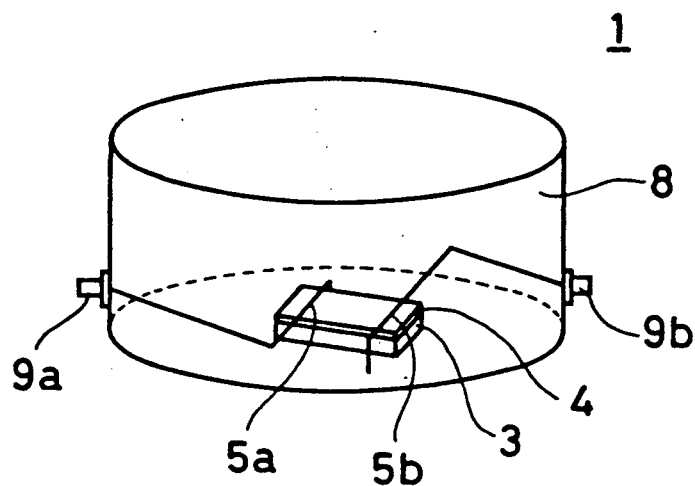
FIG. 5 is an illustrative view showing still another example of the conventional magnetostatic wave filter.
Figure 6:
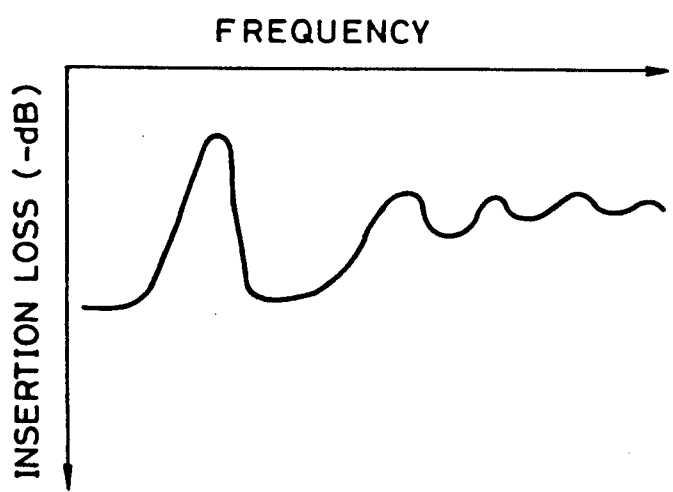
FIG. 6 is a graph showing a frequency characteristic of the conventional example as shown in FIG. 5.

According to the experiment conducted by the inventor, where the YIG thin film of, for example, 0.5 mm in longitudinal size and 1.0 mm in lateral size was used, for the conventional example as shown in FIG. 3 and the conventional example as shown in FIG. 4, the amount of passage in the attenuation band was large than $-40$ dB, while for this embodiment, the amount of passage in the attenuation band was smaller than $-80$ dB. In addition, in this case, for the conventional examples as shown in FIG. 3 and FIG. 4, the interval between the output antenna and the input antenna was set to 0.5 mm, and the thickness of these antennas was set to 30 $\mu$m.

Furthermore, since this magnetostatic wave filter 10 used no cavity, a generation of spurious radiation caused by the cavity is prevented.

In addition, in this embodiment, the waveguides 18 and 20 of the both sides are formed in a size having no cut-off frequency region in the attenuating band of the filter, but these waveguides 18 and 20 may be formed also in a size having the cut-off frequency region in the band comprising the attenuation band.

Figure 2A:
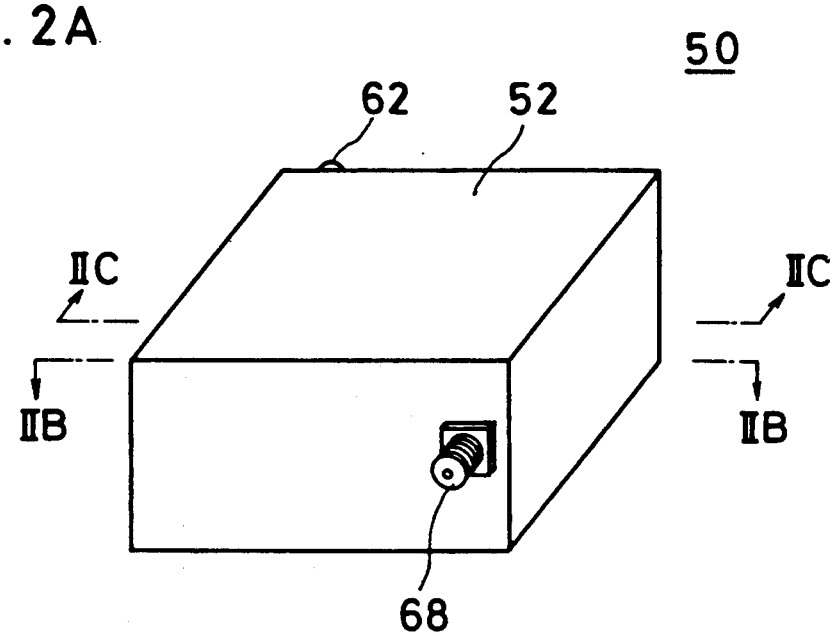
FIG. 2A through FIG. 2C show another embodiment of the present invention respectively.
Figure 2B:
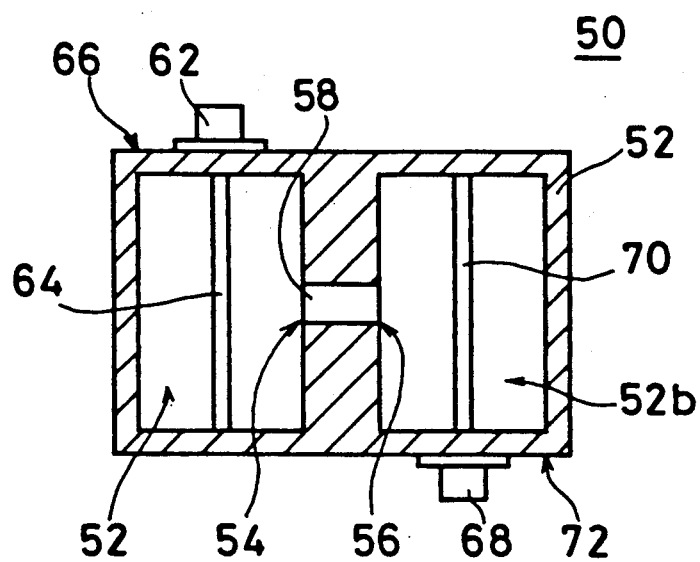
Figure 2C:
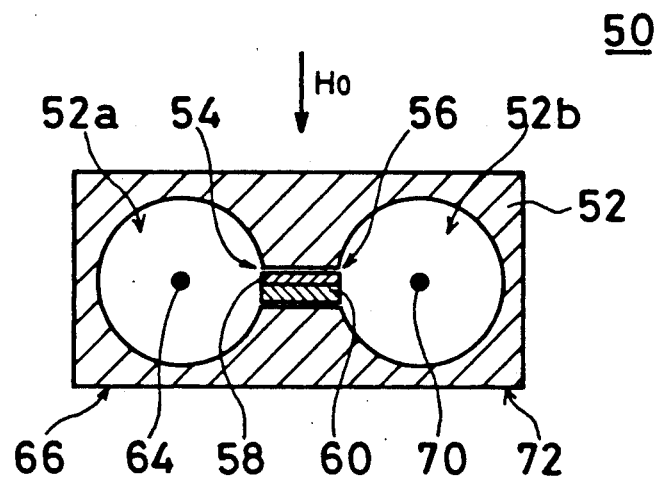

FIG. 2A through FIG. 2C show another embodiment of the present invention respectively, FIG. 2A is a perspective view thereof, FIG. 2B is a cross-sectional illustrative view taken along line IIB—IIB in FIG. 2A, and FIG. 2C is a cross-sectional view taken along line IIC—IIC in FIG. 2A.

A magnetostatic filter 50 of this embodiment comprises a rectangular-prism-shaped block 52 consisting, for example, of metal.

Inside this block 52, as shown particularly in FIG. 2B and FIG. 2C, two cylindrical space parts 52a and 52b are formed in parallel with a space therebetween.

Furthermore, inside this block 52, a hole 54 having a rectangular-shaped cross-section is formed in a manner that the intermediate portions in the axial direction of the two space portions 52a and 52b communicate with each other. Then, a waveguide 56 having the cut-off frequency region in the band comprising the attenuation band of this magnetostatic wave filter 50 is provided in the portion defining the hole 54 of the block 52.

A YIG thin film 58 is installed in the waveguide 56, that is, in the hole 54 of the block 52. In addition, like the before-mentioned embodiment, this YIG thin film 58 is formed also on one of the main surfaces of a GGG substrate 60.

Also, at one end of the block 52, an input-side coaxial connector 62 is attached in a manner communicating with one space part 52a. Furthermore, a wire-shaped inner conductor 64 in connected to the core conductor of this coaxial connector 62, and this inner conductor 64 is grounded to the other end side of the block 52 through the center axis of the space part 52a. Then, a coaxial line 66 is constituted with the block 52, the coaxial connector 62 and the inner conductor 64. Accordingly, this coaxial line 66 is connected to one end of the waveguide 56.

On the other hand, to the other end of the block 52, an output-side coaxial connector 68 is attached in a manner communicating with the other space part 52b. Furthermore, an inner conductor 70 is connected to the core conductor of this connector 68, and this inner conductor 70 is grounded to one end side of the block 52 through the center axis of the space part 52b. Then, another coaxial line 72 is constituted with the block 52, the coaxial connector 68 and the inner conductor 70. Accordingly, this coaxial line 72 is connected to the other end of the waveguide 56.

Also, as shown by an arrow $H_0$ in FIG. 2C, a dc magnetic field is applied also to this magnetostatic wave filter 50 in the direction orthogonal to the main surface of the YIG thin film 58.

In this magnetostatic wave filter 50, when a signal of TEM mode is inputted to the input-side connector 62, for example, by a coaxial cable, this signal is propagated to one end side of the waveguide 56 by the coaxial line 66.

Then, this signal is propagated as magnetostatic forward volume wave (MSFVW) to the other coaxial line 72 side on the YIG thin film 58 in the waveguide 56.

Then, the magnetostatic forward volume wave is received by the coaxial line 72, being outputted as a signal of TEM mode from the output-side coaxial connector 68.

In the magnetostatic wave filter 50 of this embodiment also, the YIG thin film 58 is installed in the waveguide 56 having the cut-off frequency band in the band comprising the attenuation band, and therefore unnecessary magnetostatic waves are removed. For this reason, the amount of attenuation in the attenuation band can be made large.

According to the experiment conducted by the inventor, where the YIG thin film of, for example, 0.5 mm in longitudinal size and 1.0 mm in lateral size was used, the amount of passage in the attenuation band was smaller than −80 dB like the before-mentioned embodiment.

Furthermore, since no cavity is used also in this embodiment, a generation of spurious radiation caused by the cavity can be prevented.

In addition, in this embodiment, the input-side coaxial connector 62 and the output-side coaxial connector 68 may be installed on the same side of the block 52, for example, on the one end side or the other end side.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A magnetostatic wave filter comprising
    a waveguide having a given cut-off frequency, and terminating in at least one end in a region of cross sectional area greater than said waveguide;
    a ferrimagnetic base material installed in said waveguide and extending for substantially the length thereof,
    said ferrimagnetic base material having a main surface extending longitudinally of said waveguide;
    whereby said cut-off frequency in said waveguide comprises an attenuation frequency.

2. A magnetostatic wave filter in accordance with claim 1, wherein said ferrimagnetic base material comprises a YIG thin film.

3. A magnetostatic wave filter in accordance with claim 2, which further comprises
    an input-side transducer connected to one end of said waveguide, and
    an output-side transducer connected to the other end of said waveguide.

4. A magnetostatic wave filter in accordance with claim 3, wherein at least one of said input-side and output-side transducers is connected to said waveguide through another waveguide.

5. A magnetostatic wave filter in accordance with claim 4, wherein at least one of said input-side and output-side transducers comprises
    a box-shaped cover attached to said another waveguide,
    a coaxial connector installed in a manner penetrating said cover, and
    an antenna, one end of which is connected to the core conductor of said coaxial connector, and which is disposed in said cover.

6. A magnetostatic wave filter in accordance with claim 2, which further comprises
    a coaxial line connected to one end of said waveguide, and
    another coaxial line connected to the other end of said waveguide.

7. A magnetostatic wave filter in accordance with claim 6, wherein said coaxial line comprises
    a block having a space part communicating with said wave guide,
    a coaxial connector penetrating said block, and
    a wire-shaped inner conductor disposed in the space part of said block, one end of which is connected to the core conductor of said coaxial connector, and the other end of which is connected to said block.

8. A magnetostatic wave filter comprising
    a waveguide having first and second sections in line with one another, and a third section intermediate said first and second sections, said third section having a transverse dimension less than said first and second sections, whereby said third section has a cut-off frequency lower than that of said first and second sections, and
    a ferrimagnetic base material positioned in said third waveguide section,
    wherein the third wave section in said waveguide comprises an attenuation region.

* * * * *